(12) United States Patent
Wang et al.

(10) Patent No.: US 9,389,337 B1
(45) Date of Patent: Jul. 12, 2016

(54) SELECTIVE COATING OF A COMPONENT USING A POTTING PROCESS

(71) Applicants: Chia-Jean Wang, Palo Alto, CA (US); Matthieu Daniel Jean Liger, Seattle, WA (US); Joseph John Hebenstreit, San Francisco, CA (US)

(72) Inventors: Chia-Jean Wang, Palo Alto, CA (US); Matthieu Daniel Jean Liger, Seattle, WA (US); Joseph John Hebenstreit, San Francisco, CA (US)

( * ) Notice: Subject to any disclaimer, the term of this patent is extended or adjusted under 35 U.S.C. 154(b) by 573 days.

(21) Appl. No.: 13/658,894

(22) Filed: Oct. 24, 2012

(51) Int. Cl.
*B05D 5/06* (2006.01)
*G02B 1/10* (2015.01)

(52) U.S. Cl.
CPC ........................................ *G02B 1/10* (2013.01)

(58) Field of Classification Search
CPC ... B05D 1/32–1/327; B05D 5/06; B05D 1/18; B05D 3/20; B05D 13/02; G02B 27/017; G02B 3/00–3/14; G02B 7/00–7/16; G02B 25/001; G02B 1/10–1/18; C23C 16/042
USPC .......... 427/162–169, 154–156, 282; 118/406, 118/428, 301, 504, 505
See application file for complete search history.

(56) References Cited

U.S. PATENT DOCUMENTS

| | | | |
|---|---|---|---|
| 3,895,135 A | 7/1975 | Hofer | |
| 4,299,866 A | 11/1981 | Clark et al. | |
| 4,885,187 A * | 12/1989 | Koenig | 427/58 |
| 5,213,849 A | 5/1993 | Maner | |
| 5,607,561 A * | 3/1997 | Gruver | C25D 5/022 118/500 |
| 5,902,647 A * | 5/1999 | Venkataramani et al. | 427/454 |
| 5,989,628 A * | 11/1999 | Haga et al. | 427/164 |
| 6,025,038 A | 2/2000 | Dowben et al. | |
| 6,077,617 A | 6/2000 | Dowben et al. | |
| 6,709,704 B2 | 3/2004 | Yamaguchi et al. | |
| 6,882,539 B2 | 4/2005 | Koike et al. | |
| 7,052,735 B2 | 5/2006 | Nate et al. | |
| 7,186,591 B2 | 3/2007 | Nehr et al. | |
| 7,510,743 B2 | 3/2009 | Subramanian | |
| 7,717,057 B2 | 5/2010 | Hutchinson et al. | |
| 2006/0073348 A1 | 4/2006 | Farmer et al. | |
| 2009/0042320 A1 * | 2/2009 | Wang et al. | 438/5 |
| 2011/0135694 A1 | 6/2011 | Bagchi et al. | |

* cited by examiner

*Primary Examiner* — Elizabeth Burkhart
(74) *Attorney, Agent, or Firm* — McDonnell Boehnen Hulbert & Berghoff LLP

(57) ABSTRACT

Methods and systems involving a potting process for selectively coating a target surface of a component. An example method may include: (1) dispensing a masking agent into a cavity, wherein the cavity is within a holder; (2) immersing a portion of a component that has a plurality of surfaces into the masking agent, such that at least one portion of a target surface from the plurality of surfaces is not immersed; (3) curing the masking agent such that the masking agent hardens on the portion of the plurality of surfaces of the component immersed in the masking agent; (4) coating the target surface with a coating agent; and (5) separating the masking agent from the portion of the plurality of surfaces of the component immersed in the masking agent.

20 Claims, 9 Drawing Sheets

SELECTIVE COATING OF A COMPONENT USING A POTTING PROCESS

BACKGROUND

Unless otherwise indicated herein, the materials described in this section are not prior art to the claims in this application and are not admitted to be prior art by inclusion in this section.

Various types of manufacturing processes exist for producing various components. One example of a manufacturing process involves a potting process, where a masking agent covers a component. Additionally, components may be coated using a coating process. An example of a component includes an eyepiece that requires selective coating on one of its surfaces.

SUMMARY

In a first aspect, a method is provided. The method may include: (1) dispensing a masking agent into a cavity, wherein the cavity is within a holder; (2) immersing a portion of a component that has a plurality of surfaces into the masking agent, such that at least one portion of a target surface from the plurality of surfaces is not immersed; (3) curing the masking agent such that the masking agent hardens on the portion of the plurality of surfaces of the component immersed in the masking agent; (4) coating the target surface with a coating agent; and (5) separating the masking agent from the portion of the plurality of surfaces of the component immersed in the masking agent.

In a further aspect, a system is provided. The system may include: (1) a holder, wherein a masking agent is dispensed into a cavity located within the holder; (2) a component, wherein a portion of the component that has a plurality of surfaces is immersed into the masking agent such that at least one portion of a target surface from the plurality of surfaces is not immersed; and (3) a control system configured to: (a) cure the masking agent such that the masking agent hardens on the portion of the plurality of surfaces of the component immersed in the masking agent; (b) coat the target surface with a coating agent; and (c) separate the masking agent from the portion of the plurality of surfaces of the component immersed in the masking agent.

In yet a further aspect, an apparatus is disclosed. The apparatus may include: a holder having one or more cavities, each cavity comprising a bottom surface, wherein the bottom surface comprises three prongs that extend upwardly for holding a component in the cavity on a planar surface.

These as well as other aspects, advantages, and alternatives, will become apparent to those of ordinary skill in the art by reading the following detailed description, with reference where appropriate to the accompanying drawings.

DETAILED DESCRIPTION

Figure 1A:
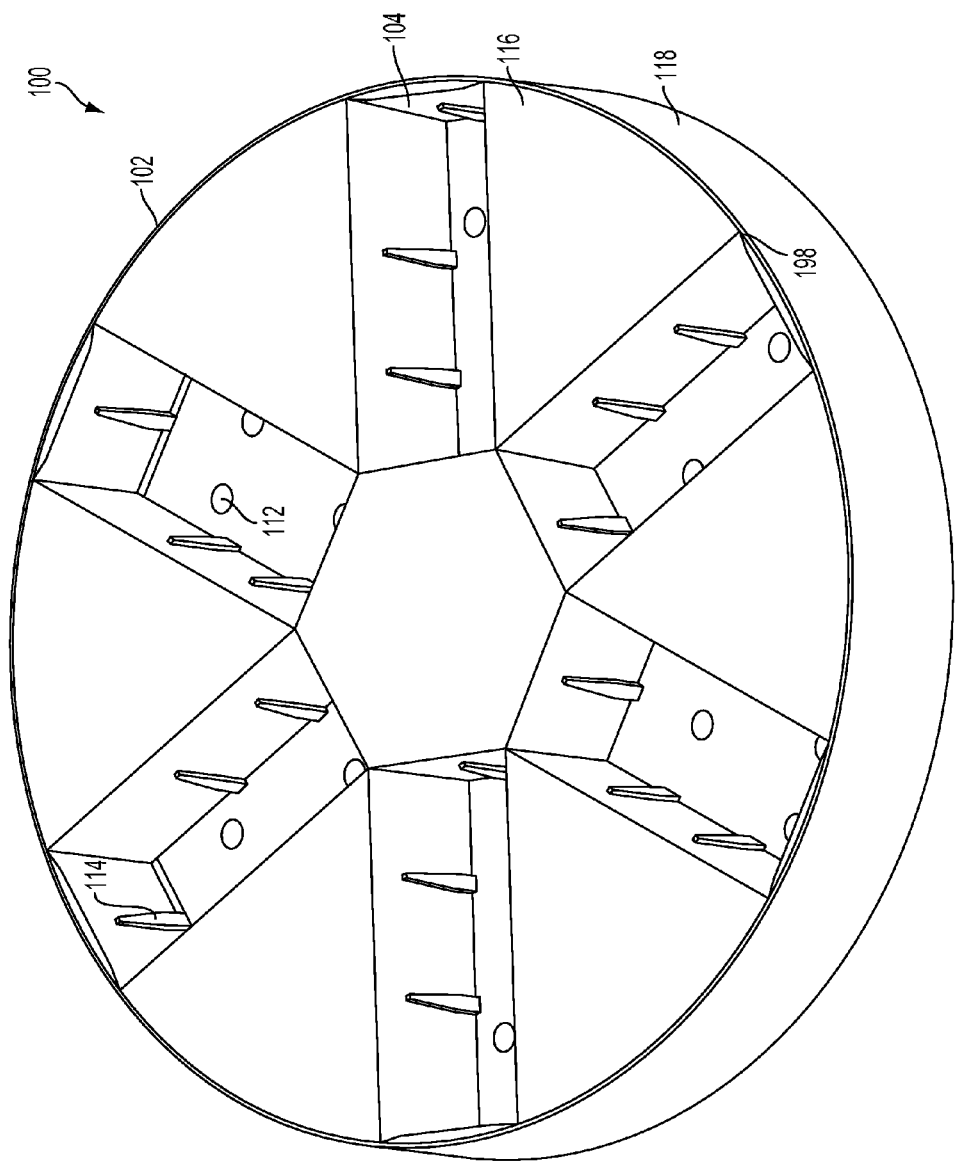
FIG. 1A shows an example system for selectively coating a component using a potting process, according to an example embodiment.

Example methods and systems are described herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the Figures or otherwise described herein should not be viewed as necessarily limiting. It should be understood that other embodiments may include more or less of each element shown in a given Figure. Further, some of the illustrated elements may be combined or omitted. Yet further, an example embodiment may include elements that are not illustrated in the Figures.

1. OVERVIEW

Large-scale production of devices often requires intricate detailing to be performed on components using automated processes. For example, some components, such as an eyepiece, may necessitate a coating be applied to a target surface or surfaces of the component. Large-scale application of coatings may prove difficult due to the need for precise application. Thus, for these and other reasons, all surfaces other than the targeted surface or surfaces may be covered with a masking agent, allowing for precise application of a coating only on the targeted surface or surfaces.

Accordingly, the systems and methods described herein may help provide for more convenient and/or efficient techniques for selectively coating a component using a potting process. Specifically, the systems and methods may enable protection of surfaces on a component where coating should be avoided while achieving a well-defined edge of the coating with respect to the substrate interface. Furthermore, the combination of a holder geometry and material with the potting compound may be optimized for compatibility with mass production chemistries and treatment to improve yield.

The example embodiments described herein may help to provide a technique for applying a masking agent to all surfaces of the component except for the target surface, curing the masking agent, coating the target surface with the desired coating agent, and then separating the masking agent from the surfaces of the component, leaving only the target surface coated with the coating agent. Since the ability to apply such coatings may be difficult in large-scale production due to the need for precise application, a system is disclosed to aid in the selective application of the coating agent to the target surface.

The manufacture of a component may involve the application of a coating on a particular surface. For example, an eyepiece to be used in an ocular apparatus may require a coating on its outermost surface while the other surfaces must remain free of the coating. In order to do so, an example manufacturing system may include a holder with a number of cavities that are each shaped to fit the component. Further, in some embodiments, each cavity may include one or more prongs and stabilizers that support a component that is being coated by extending outward such that the component may rest on them. The holder may include an injectable molded plastic such that it is reusable, recyclable, or disposable and can easily be shaped to correspond to the shape of the component. The holder may additionally include localized thin-wall features to allow for easy separation of component from the holder.

Dispensing the masking agent may include pouring the masking agent into the cavities. Alternatively, the masking agent may be contained in reservoirs connected to the cavities such that the masking agent may propagate into the cavity. The amount of masking agent may be a predetermined volume in order to adequately cover the surfaces of the component to be coated by the masking agent (non-target surfaces). Further, the masking agent may be water-soluble or solvent-soluble, or mixed with a surfactant. In an alternative embodiment, dispensing the masking agent into the cavities may occur after the component has been placed into the cavity.

Immersing a portion of the component may include inserting the component into the cavity, such that all of the surfaces of the component, except for a target surface, become immersed in the masking agent. The component may rest on prongs extended outwardly from the bottom surface of the cavity. Alternatively, the component may be placed in the cavity prior to the introduction of the masking agent and the masking agent may be propagated into the cavity.

The masking agent may then be cured such that it hardens on the portion of the number of surfaces of the component immersed in the masking agent and may become impermeable. Once the masking agent has cured, the target surface may remain exposed. The target surface may then be coated using a coating agent. The target surface may be coated using a number of techniques including, but not limited to, spin coating, spray coating, gel coating, or powder coating. Furthermore, the coating agent may include, but is not limited to, an anti-reflection agent, a photochromic agent, a hydrophobic agent, a polarizing agent, an oleophobic agent, or an anti-scratch agent.

Separating the masking agent from the surfaces of the component may involve mechanically removing the masking agent. In an alternative embodiment, separating the masking agent from the surfaces of the component may involve dissolving the masking agent in a dissolving solution. The dissolving solution may include hydrophilic or hydrophobic solutions. The application of heat may also be used to assist in the separation. Thus, once the masking agent is separated, the target surface of the component is properly coated, leaving the other surfaces free of the coating agent.

It should be understood that the examples discussed above are provided for purposes of example and explanation only and should not be taken to be limiting.

2. EXAMPLE SYSTEM

FIG. 1A illustrates an example coating system 100 for selectively coating a target surface of a component using a potting process. While FIG. 1A illustrates a coating system 100 as an example of a selective coating system, other types of coating systems could additionally or alternatively be used. As illustrated in FIG. 1A, the coating system 100 may include a holder 102 that has a surface 116 and a side 118, in addition to a number of cavities 104. Each of the cavities 104 may include stabilizers 114 located on the side of each cavity and prongs 112 located at the base of each cavity. As an example, the coating system 100 may be used when applying a photochromic coating to an eyepiece.

The holder 102 may be formed of a solid structure of plastic and/or metal, or may be formed of a hollow structure of similar material so as to decrease weight and maximize balance. In an example embodiment, the holder 102 may be formed using thermoplastic or thermosetting plastic materials such that it may be used in an injection molding process. The holder 102 may be reusable, recycled, or disposed of. Alternatively, the holder 102 may be formed of an ultraviolet transmissible material. Other materials may be possible as well.

The holder 102 may be shaped according to the preferred coating process. In an example embodiment, the holder 102 may be formed in a cylindrical shape for use in a spin coating process such that a coating may be applied on a target surface, as further discussed below. The cylindrical shape of the holder 102 may facilitate equal distribution of a coating material on the surface of the manufactured component. Additionally, the cylindrical shape may facilitate proper balance of the holder 102 during the spin coat process. Other shapes may be possible as well.

The size of the holder 102 may also be determined according to the size and shape of the manufactured component. Alternatively, the size of the holder 102 may be determined by the size and shape of the machines used in the manufacturing process. At a minimum, the surface 116 and side 118 should be shaped such that the component to be coated may be appropriately covered by the masking agent while resting in the cavity 104.

In an example embodiment, the component may be comprised of an optical piece. For example, the component may be an eyepiece for a head mounted display (HMD). The eyepiece of a HMD may require a coating on the outer surface in order to protect the eyepiece itself from exposure or damage, or protect the eye of the user. In one embodiment, a photochromic coating agent may be applied to the outer surface of the eyepiece. Other coatings may be applied. Additionally, other components may be possible.

The number of cavities 104 located in the holder 102 may vary. For instance, the number may depend on the size of the desired component being coated. Additionally, the number chosen should be determined such that the position of the cavities may provide balance to the holder 102, as shown in FIG. 1A. The holder 102 may contain only one cavity such that only one component may be coated at a time. Alternatively, the holder may contain more than one cavity such that multiple components may be coated at one time. The use of multiple cavities may increase the efficiency and production of a manufacturing process.

One or more of each of the cavities 104 may be formed by an indentation of the holder 102. Each cavity 104 may also be sufficiently shaped to allow a component to properly rest in the cavity, leaving only the target surface exposed such that the non-target surfaces may be covered by the masking agent and the holder remains balanced. Thus, each cavity may be shaped to allow the component and the addition of the masking agent to occupy the cavity at the same time. A reservoir containing the masking agent may be attached to or otherwise located near each cavity 204, such that the masking agent may flow or be pumped into each cavity from the reservoir. Alternatively, one single reservoir may pump or pour the masking agent into the cavities. Alternatively, the masking agent may be dispensed in the cavity from above the holder. The cavity may be sufficiently formed such that it is capable of holding and retaining the masking agent during the selective coating process.

The layout of the cavities 104 with respect to each other in the holder 102 may provide balance to the holder during the manufacturing process, which in turn may help to achieve an even coating of the masking agent and coating agent during the process. In a further aspect, as illustrated in FIG. 1A, six rectangular cavities may be evenly spaced in a circular manner such that the holder remains balanced during a spin coat treatment. Other numbers of cavities, shapes, and orientations may be available as well. Holder geometries may be optimized to increase the component quantities for deposition efficiency as well as throughput with manufacturing line equipment.

The side 118 of the holder 102 may include localized thin-wall features 198 at the corner of each cavity 104. The localized thin-wall features may aid in the removal of the component from the cavity 104. For example, where the side 118 meets the corner of each cavity 104, the holder 102 may be composed of a thinner wall that facilitates easy tearing, however other features could facilitate easy tearing as well. Thus, the localized thin-wall features 198 may allow the holder surface 116 to be broken apart in order to enable better access to mechanically remove the coated component.

The cavities 104 may also include one or more prongs 112 at the bottom of the cavity. The prongs 112 may extend outwardly from the surface of the cavity in order assist with the placement of the component. Specifically, the component may rest on the prongs during the selective coating process to ensure that the target surface remains level and parallel with the holder surface 116. In the example embodiment illustrated in FIG. 1A, three prongs 112 are displayed, thus creating a plane to rest the component on.

Additionally, the cavity 104 may include stabilizers 114 located on the sides of the cavity. The stabilizers 114 may stabilize the component once it has been placed in the cavity 102 and during the coating process.

Figure 1B:
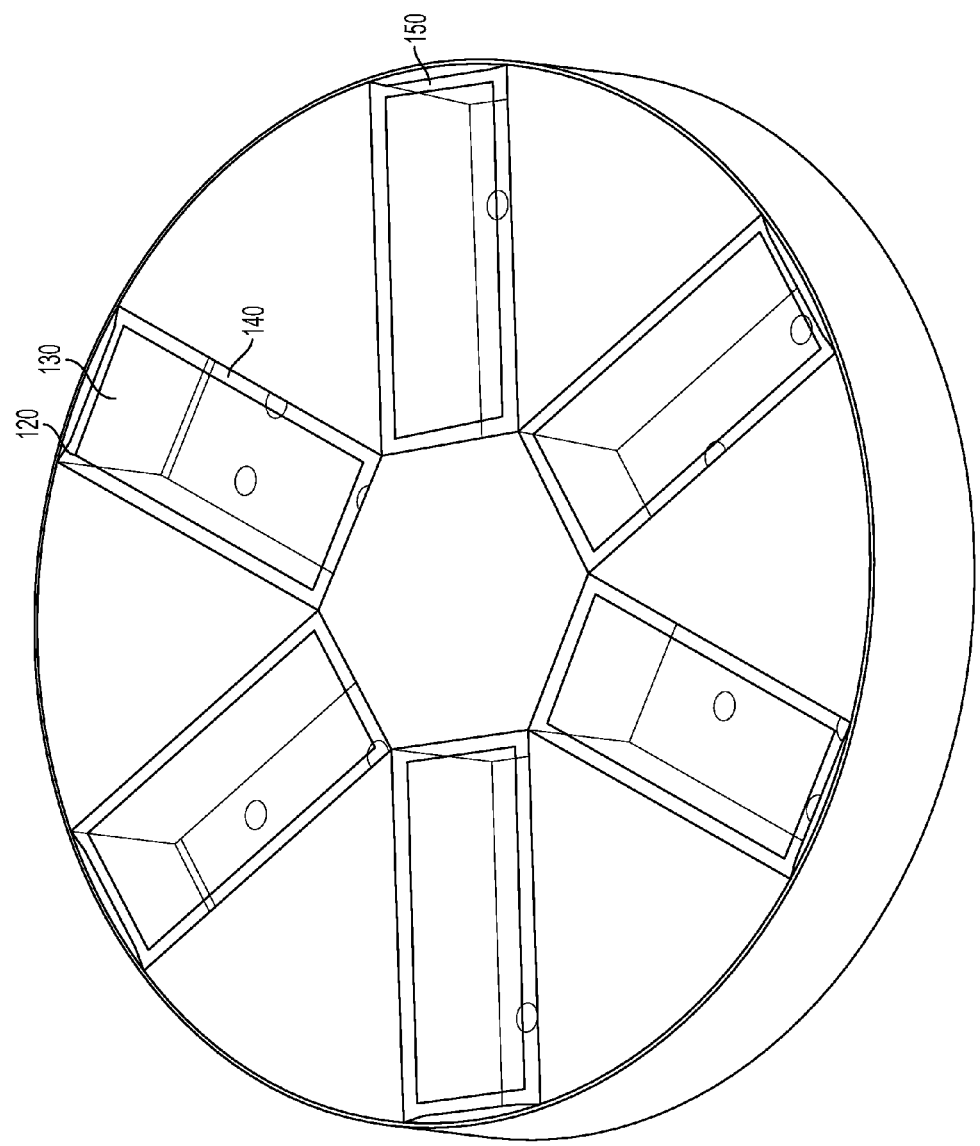
FIG. 1B shows an example system for selectively coating a component using a potting process, according to an example embodiment.

FIG. 1B further illustrates an example coating system 100 for selectively coating a target surface of a component using a potting process. As illustrated in FIG. 1B, the coating system 100 may further include a component 120, which contains a target surface 130 and one or more non-target surfaces 140, in addition to a holder space 150. The holder space 150 may be adjacent to the one or more non-target surfaces 140. Further, the component 120 may rest in the cavity 104, with the target surface 130 exposed and level with the holder surface 116 and the non-target surfaces in contact with the prongs 112 and stabilizers 114.

The component 120 may be any component that requires the application of a coating agent to a target surface. In an example embodiment, the component used in the selective coating process may be an eyepiece to be used in an ocular apparatus. Specifically, a coating agent, including but not limited to, photochromic agent, may be applied to the outer surface of the eyepiece. Other coating agents may be possible as well, as further discussed below.

One or more of the non-target surfaces 140 may be located within the cavity 104 in the holder 102 such that when a masking agent is propagated or dispensed into the cavity, the non-target surfaces 140 may be covered by the masking agent. Further, the target surface 130 may remain exposed facing outwardly from the cavity 104 such that when the masking agent is propagated or dispensed into the cavity, the target surface 130 may remain void of the masking agent.

Between the non-target surfaces 140 of the component 120 and the walls of the cavity 104, the holder 102 may include a space 150 in order for the masking agent to accumulate around the non-target surfaces 140. The space 150 may vary based on the size and shape of the component 120 compared to the size and shape of the cavity 104. The space 150 may assist in allowing the curing process to proceed efficiently, as further discussed below. Further, the bottom surface of the component 120 may rest on the prongs 112 located at the bottom of the cavity 104. As discussed above, the prongs may help ensure that the target surface 130 remains level and parallel with the holder surface 116. Likewise, the stabilizers 114 may aid in maintaining the position of the component 120 within the cavity 104 such that a masking agent may uniformly coat the non-target surfaces 140 during the selective coating process 100 and keep the component 120 from shifting. The target surface 120 and non-target surface 140 will be further discussed below.

Figure 1C:
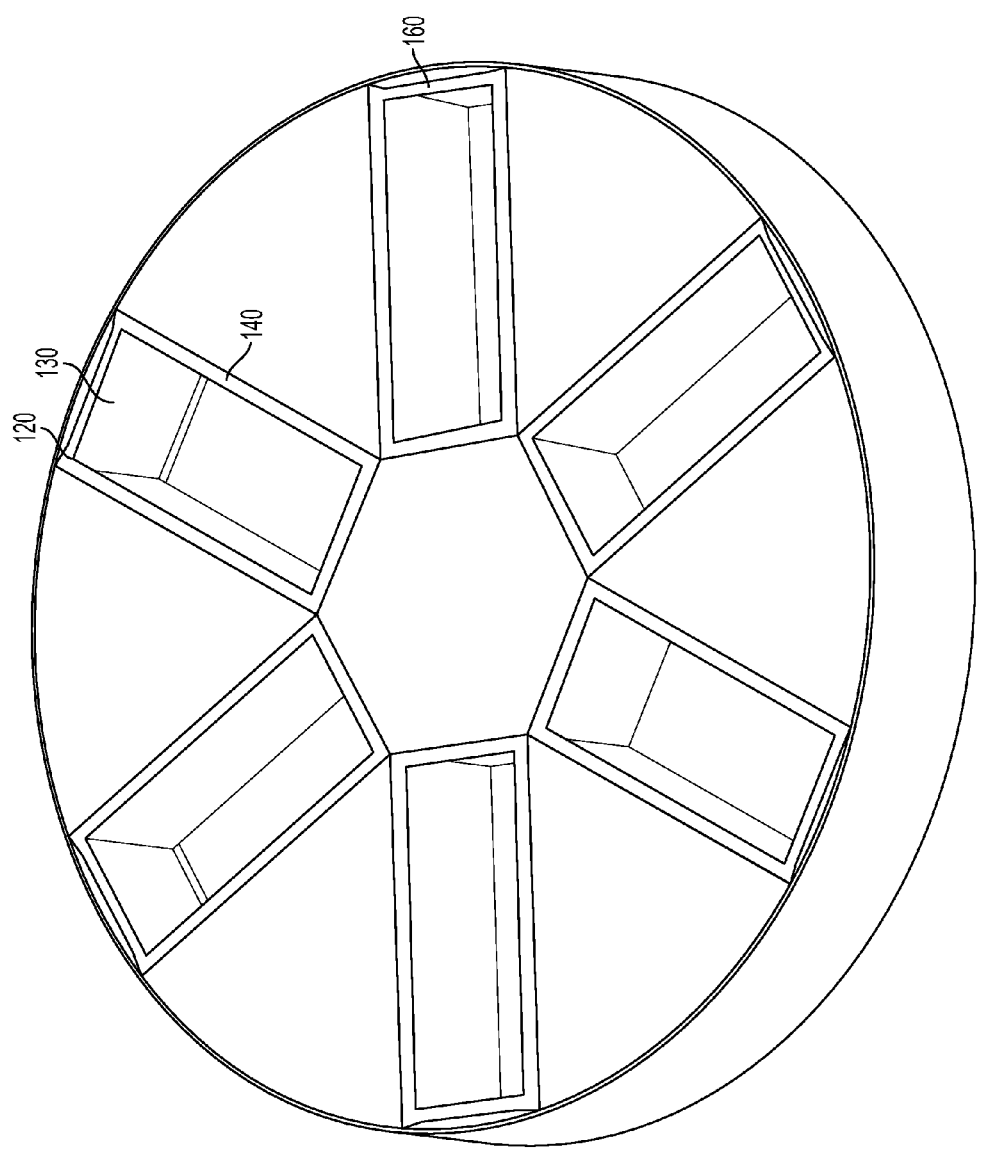
FIG. 1C shows an example system for selectively coating a component using a potting process, according to an example embodiment.

FIG. 1C illustrates an example coating system 200 for selectively coating a component using a potting process. The system is shown in the form of a coating system 100. While FIG. 1C illustrates a coating system 100 as an example of a selective coating system, other types of coating systems could additionally or alternatively be used. As illustrated in FIG. 1C, the coating system 100 further includes a component 120, with a target surface 130 and a non-target surface 140, along with a masking agent 160 within a space 150 located between the walls of the cavity 104 and the component 120.

As shown in FIG. 1C, the coating system may include a masking agent 160 that is propagated or dispensed into the cavity 104. Specifically, the masking agent may fill the space 150 between the non-target surfaces 140 and the walls of the cavity 104. The amount of the masking agent 160 may be pre-determined based on the number of non-target surfaces the user wishes to protect from a coating agent on the component 120. Once the masking agent has reached the desired non-target surfaces, only the target surface should remain exposed and free of the masking agent.

In one embodiment, the masking agent 160 may be a water-soluble composition, including, but not limited to, a water-soluble resin. Alternatively, the masking agent 160 may be a solvent-soluble composition, including, but not limited to, a solvent-soluble resin. Other possibilities for masking agents include agents that may be thermal and/or UV cured and may be peeled off for removal or dissolved through additional exposure to light or temperature conditions. Surfactants may be added to the masking agent 160 to lower the surface tension and increase viscosity, thus allowing the liquid to dispense or propagate more easily. Further, the masking agent 160 may be heated in order to lower the surface tension. The masking agent 160 may be in either liquid or solid form before it is dispensed into the cavity 104.

Propagation of the masking agent 160 may occur through the use of a reservoir connected to each cavity 104 such that the masking agent may flow into the cavity from another location. Alternatively, dispensing the masking agent 160 into the cavity may include pouring the masking agent into the cavity from above the holder 102. In one embodiment, the component 120 may already be resting in the cavity 104 of the holder 102 when the masking agent 160 is propagated into the cavity. In an alternative embodiment, the component 120 may be immersed in the masking agent 160 after it has already been dispensed into the cavity 104.

According to an example embodiment, once the component 120 is properly positioned in the cavity 104 and immersed in the masking agent 160 such that the non-target surfaces 140 are sufficiently covered by the masking agent, the masking agent may be cured. Curing the masking agent 160 may transform the masking agent by hardening it into a semi-solid or solid state, such that it hardens around the non-target surfaces 140. Alternatively, curing the masking agent 160 may transform the masking agent into a gel medium. The masking agent 160 may become impermeable such that the coating agent 170 will not dissolve into the masking agent 160.

Curing the masking agent 160 may occur through various methods. Generally, the type of curing method chosen is dependent on the composition of the masking agent 160. In one embodiment, curing the masking agent 160 may occur through the use of temperature curing, where the masking agent hardens due to a drop in temperature. Alternatively, curing may be accomplished through the use of ultraviolet light that hardens the masking agent 160. Other curing methods may be possible as well. Once curing has occurred, the masking agent 160 may be impermeable to the coating agent 170 such that the non-target surfaces will not be exposed to the coating agent.

Figure 1D:
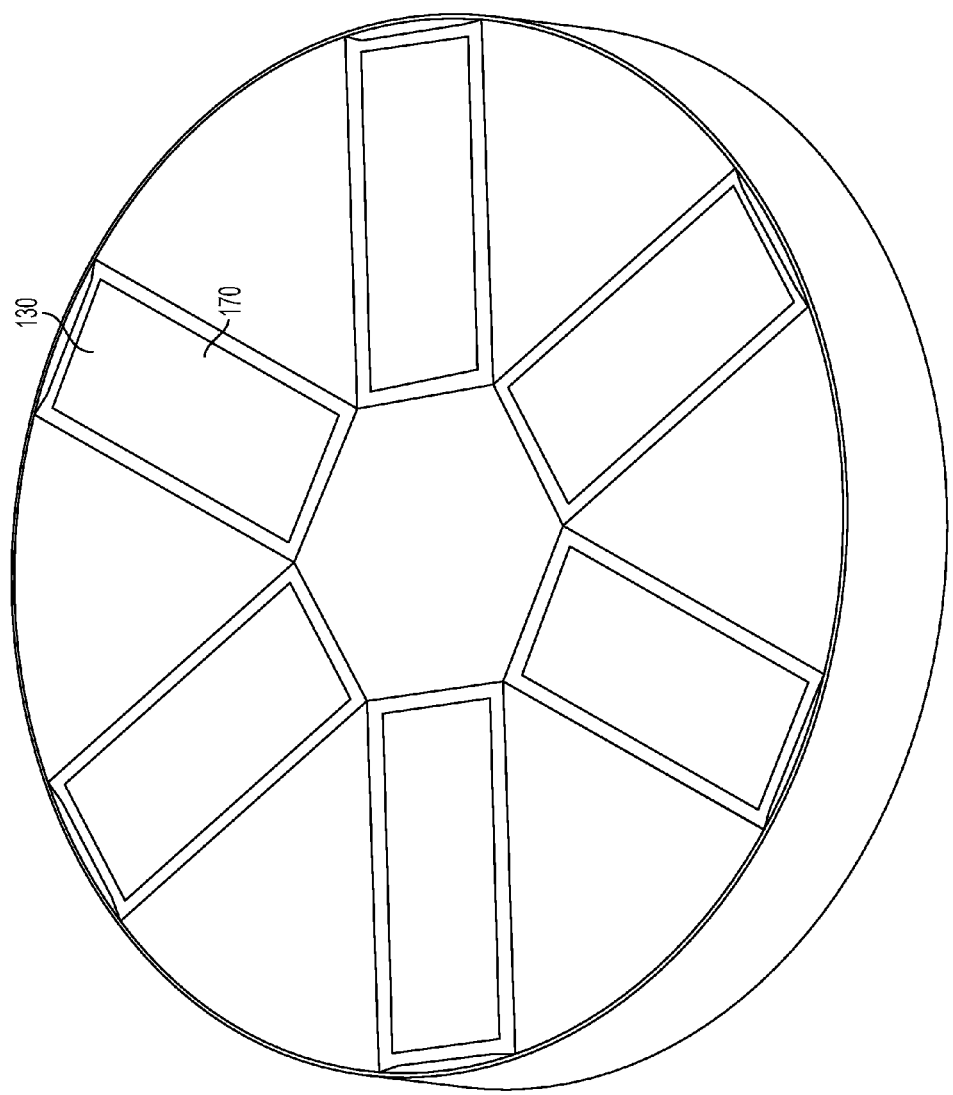
FIG. 1D shows an example system for selectively coating a component using a potting process, according to an example embodiment.

In FIG. 1D, component 120 with target surface 130 is illustrated with a coating agent 170 applied. The coating agent may be applied only locally to the target surface 130 or over the target surface and the holder surface 116 at the same time. The coating process may be accomplished using various methods, including, but not limited to, spin-coating, airbrushing, vapour deposition, physical deposition, or dip coating.

In an example embodiment, the target surface of an eyepiece is coated using a spin-coating process, where the coating agent 170 is applied to the center of the holder 102. Once the holder 102 begins spinning, the centrifugal force distributes the coating agent 170 evenly over the target surface 130 of the component 120. Since the position of the masking agent 160 surrounding the non-target surfaces 140 is level and parallel to the surface 116 of the holder 102, the coating agent 170 cannot reach the non-target surfaces 140. Thus, only the target surface will be coated with the coating agent 170. The composition of the coating agent 170 may include, but is not limited to, an anti-reflection coating, a photochromic coating, a hydrophobic coating, a polarizing coating, an oleophobic coating, or an anti-scratch coating. Other types of coatings may be possible as well.

Figure 1E:
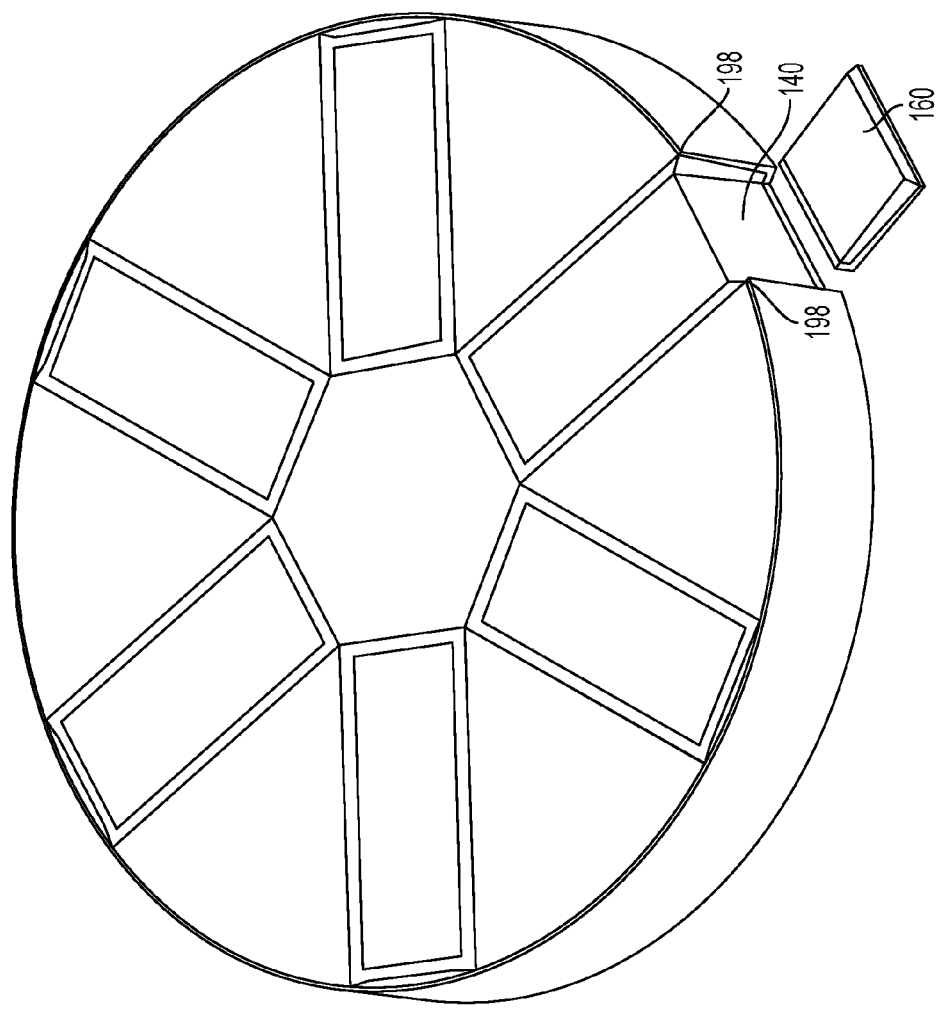
FIG. 1E shows an example system for selectively coating a component using a potting process, according to an example embodiment.

FIG. 1E illustrates an example embodiment with a holder 102 containing a localized thin-wall feature 198 within the holder side 118. The localized thin-wall feature 198 may aid in the removal of the component from the holder 102 by allowing a wall of the cavity 104, which corresponds to the holder side 118, to be removed. When the wall of the cavity is removed, the component 120 may be more easily released.

In an alternative embodiment, the masking agent 160 may be removed mechanically through the creation of a tab using the masking agent during the curing process. Thus, after the masking agent 160 has cured and the coating agent 170 has been applied, the tab may be pulled in order to release the masking agent away from the non-target surfaces 140. Mechanical removal of the component may also occur without the use of a tab, for example, if an individual peels off the masking agent.

Figure 1F:
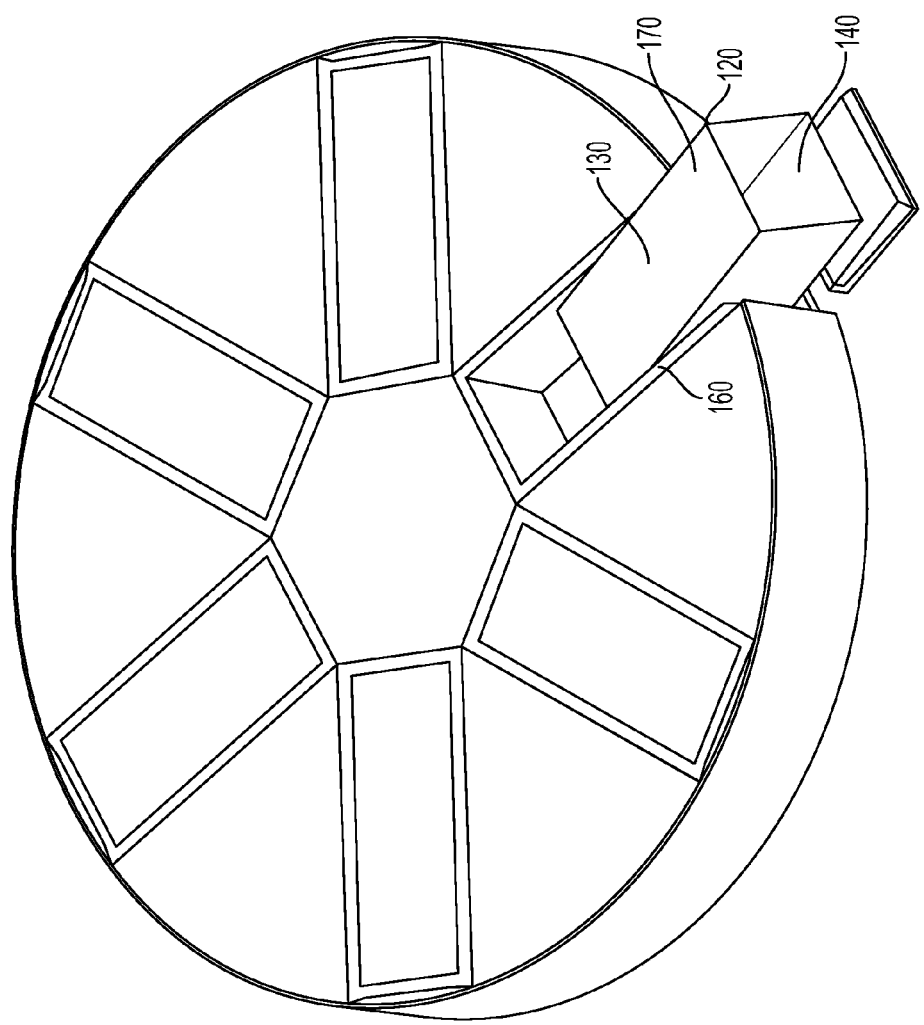
FIG. 1F shows an example system for selectively coating a component using a potting process, according to an example embodiment.

While FIGS. 1E and 1F illustrate mechanical removal of the component 120 from the masking agent and holder 102, other removal methods are possible as well. In one embodiment, the masking agent 160 may remain adhered to the component 120 after being cured. In an alternative embodiment, the masking agent 160 may adhere to the holder 102. In order to remove the masking agent from either the holder 102 or the component 120, the masking agent may be dissolved by a release agent, which may act to inhibit or weaken the adhesion between the masking agent and the holder or component. The release agent may be applied to either the component 120 or the holder 102, or both. Further, the release agent may be either a water or solvent solution, depending on the composition of the masking agent, such that the masking agent is dissolvable in the solution. Other types of releasing agents for dissolving the masking agent may be possible. Further, the release agent may be heated in order to increase the speed of the dissolving process. As such, the masking agent 160 may be sublimated or decomposed into volatile compounds.

3. EXAMPLE METHODS

Figure 2:
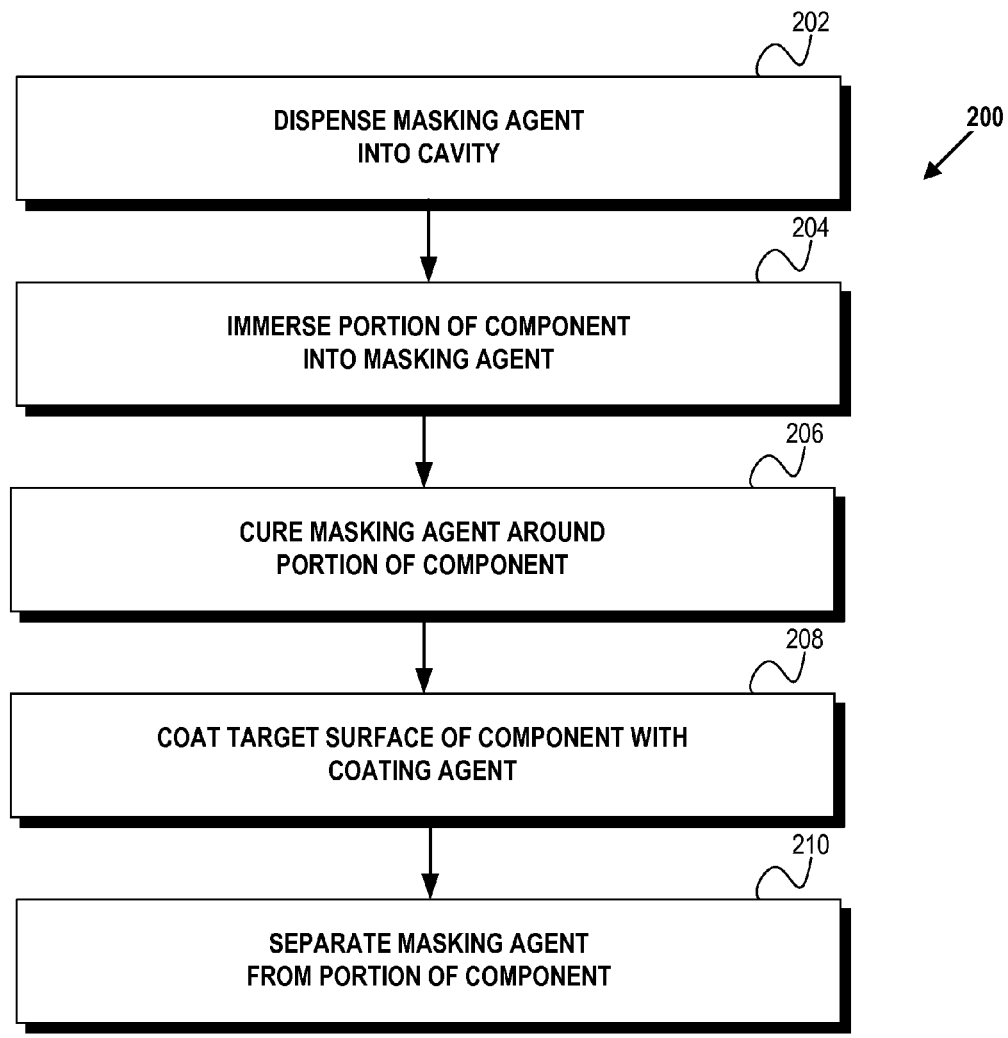
FIG. 2 is a flowchart illustrating a method, according to an example embodiment.

FIG. 2 shows a flowchart depicting an example method for selectively coating a component using a potting process. Method 200 may be carried out by a coating system as illustrated in FIGS. 1A-1F and FIGS. 3A-3D. However, it should be understood that example methods, such as method 200, may be carried out by systems other than the coating system described above.

Further, those skilled in the art will understand that the flowchart described herein illustrates functionality and operation of certain implementations of example embodiments. In this regard, each block of the flowchart may represent a module or system that is capable of performing specific logical functions or steps in the selective coating process.

Figure 3A:
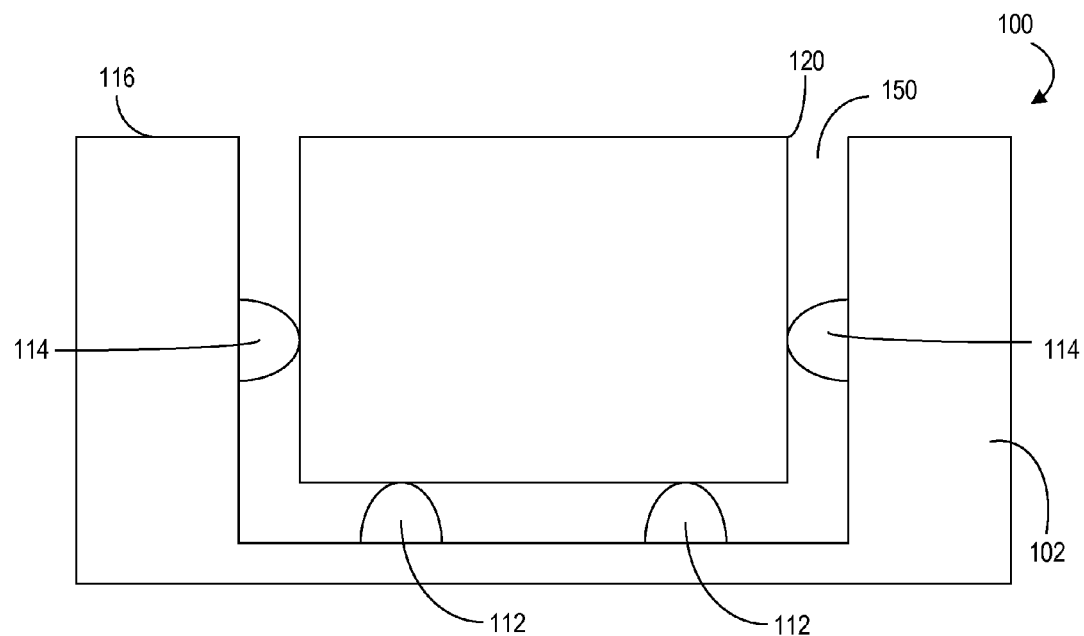
FIG. 3A shows a cross-sectional view of an example system for selectively coating a component using a potting process, according to an example embodiment.
Figure 3B:
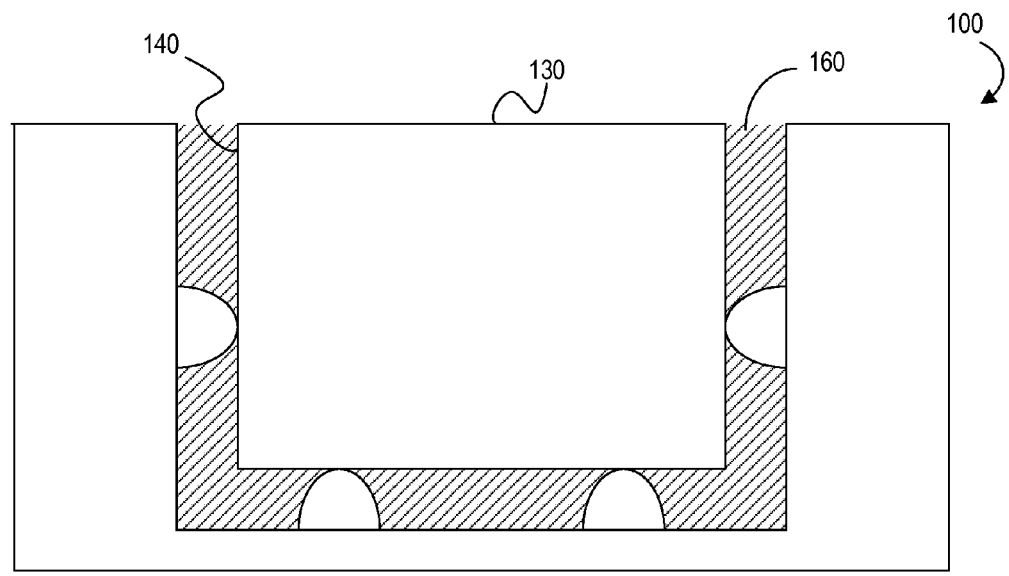
FIG. 3B shows a cross-sectional view of an example system for selectively coating a component using a potting process, according to an example embodiment.
Figure 3C:
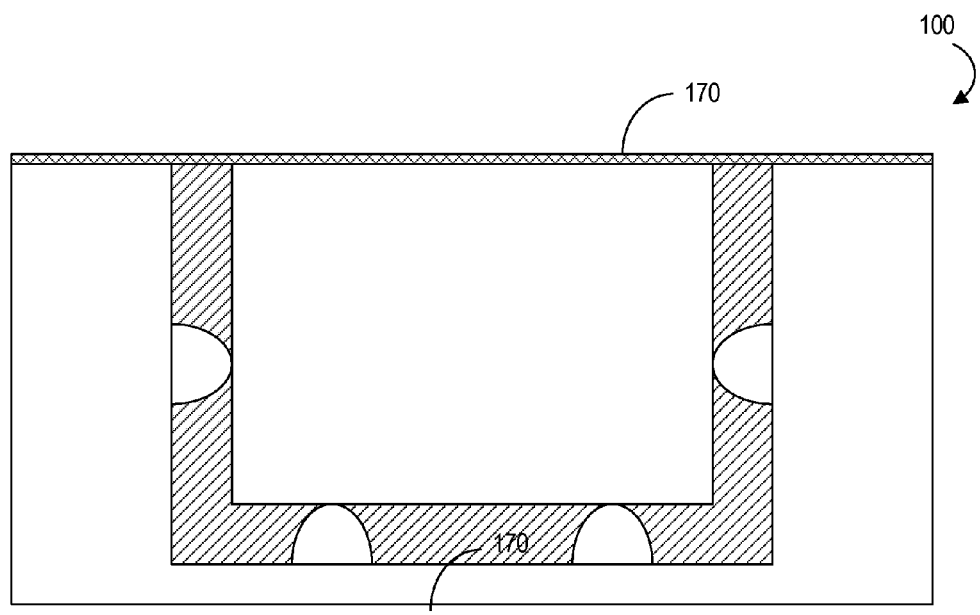
FIG. 3C shows a cross-sectional view of an example system for selectively coating a component using a potting process, according to an example embodiment.
Figure 3D:
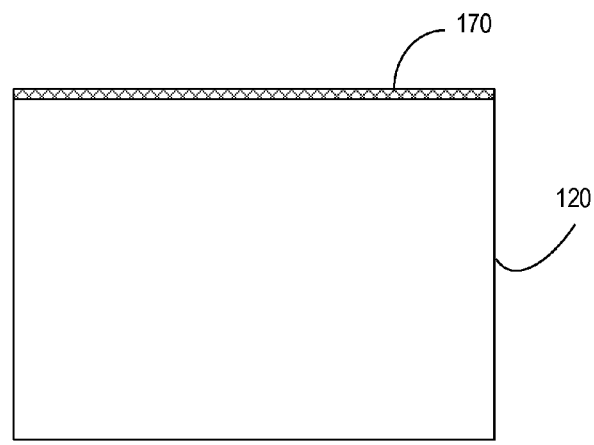
FIG. 3D shows a cross-sectional view of an example system for selectively coating a component using a potting process, according to an example embodiment.

Example method 200 begins at step 202 with dispensing a masking agent into a cavity, where the cavity is located within a holder. At step 204, a portion of a component that has a number of surfaces is immersed into the masking agent such that at least one portion of a target surface from the number of surfaces is not immersed in the masking agent. In an example embodiment, the component is an eyepiece that is part of an ocular apparatus. Further, in an alternative embodiment, the masking agent may be added to the cavity after the component has been placed in the cavity, as shown in FIGS. 3A and 3B. At step 206, the masking agent is cured such that it hardens on the portion of the number of surfaces of the component immersed in the masking agent. At step 208, the target surface is coated with a coating agent, as shown in FIG. 3C. And at step 210, the masking agent is separated from the portion of the number of surfaces of the component immersed in the masking agent, as shown in FIG. 3D. Each of the blocks shown with respect to FIG. 2 is discussed further below.

4. CONCLUSION

The above detailed description describes various features and functions of the disclosed systems, components, and methods with reference to the accompanying figures. While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A method comprising:
   dispensing a masking agent into a cavity, wherein the cavity includes three or more prongs extending outwardly from the surface of the cavity, and wherein three of the prongs are in a triangular arrangement to create a plane to assist with the placement and stability of a component, and wherein the cavity is within a holder;
   immersing a portion of an optical piece that has a plurality of surfaces into the masking agent, such that at least one portion of a target surface from the plurality of surfaces is not immersed;
   curing the masking agent such that the masking agent hardens on the portion of the plurality of surfaces of the optical piece immersed in the masking agent;
   coating the target surface with a coating agent; and
   separating the masking agent from the portion of the plurality of surfaces of the optical piece immersed in the masking agent.

2. The method of claim 1, wherein the optical piece is comprised of an eyepiece of a head-mounted display (HMD).

3. The method of claim 1, where in the cavity is one cavity of a plurality of cavities, wherein the plurality of cavities is within a holder.

4. The method of claim 1, wherein separating the masking agent from the portion of the plurality of surfaces of the component immersed in the masking agent comprises dissolving the masking agent.

5. The method of claim 4, wherein the dissolving further comprises dissolving the masking agent in a dissolving solution.

6. The method of claim 5, wherein the dissolving solution is water.

7. The method of claim 1, wherein the separating the masking agent from the portion of the plurality of surfaces of the component immersed in the masking agent comprises mechanically removing the masking agent.

8. The method of claim 1, wherein the cavity is of a predetermined size and shape.

9. The method of claim 1, wherein the cavity is comprised of a bottom surface with at least one prong.

10. The method of claim 1, wherein the cavity is comprised of a bottom surface with three prongs.

11. The method of claim 1, wherein dispensing the masking agent further comprises a reservoir configured to dispense the masking agent into the cavity, wherein the reservoir is connected to the cavity.

12. The method of claim 1, wherein the masking agent is water-soluble.

13. The method of claim 1, wherein the masking agent is solvent-soluble.

14. The method of claim 1, wherein the masking agent is mixed with a surfactant.

15. The method of claim 1, wherein curing the masking agent further comprises increasing or decreasing the temperature of the masking agent.

16. The method of claim 1, wherein curing the masking agent further comprises exposing the masking agent to ultraviolet light.

17. The method of claim 1, wherein the coating agent is at least one of an anti-reflection agent, a photochromic agent, a hydrophobic agent, a polarizing agent, an oleophobic agent, or an anti-scratch agent.

18. The method of claim 1, wherein the holder is composed of an injection molded plastic.

19. The method of claim 1, wherein the masking agent is of a predetermined volume.

20. The method of claim 1, wherein separating the masking agent from the portion of the plurality of surfaces of the component immersed in the masking agent further comprises heating the masking agent to a desired temperature.

* * * * *